(12) United States Patent
Kobayashi et al.

(10) Patent No.: US 7,518,289 B2
(45) Date of Patent: Apr. 14, 2009

(54) ACTUATOR

(75) Inventors: Kazuhiro Kobayashi, Fujiyoshida (JP); Keita Watanabe, Fujiyoshida (JP); Shigehisa Watanabe, Fujiyoshida (JP); Yoshiro Ohkawa, Kawasaki (JP)

(73) Assignees: Citizen Electronics Co., Ltd., Yamanashi (JP); Authentic, Ltd., Kanagawa (JP)

( * ) Notice: Subject to any disclaimer, the term of this patent is extended or adjusted under 35 U.S.C. 154(b) by 524 days.

(21) Appl. No.: 11/253,791

(22) Filed: Oct. 20, 2005

(65) Prior Publication Data

US 2006/0104171 A1    May 18, 2006

(30) Foreign Application Priority Data

Oct. 20, 2004    (JP)    ............... P2004-305840

(51) Int. Cl.
    *H01L 41/053*    (2006.01)
(52) U.S. Cl. ............... 310/331; 310/353; 310/354
(58) Field of Classification Search ......... 310/330–332, 310/348, 352–354
    See application file for complete search history.

(56) References Cited

U.S. PATENT DOCUMENTS

| 4,333,029 | A | * | 6/1982 | Kolm et al. | ............... | 310/329 |
| 4,492,360 | A | * | 1/1985 | Lee et al. | ............... | 251/129.06 |
| 4,498,851 | A | * | 2/1985 | Kolm et al. | ............... | 417/410.2 |
| 4,625,137 | A | * | 11/1986 | Tomono | ............... | 310/317 |
| 4,780,062 | A | * | 10/1988 | Yamada et al. | ............... | 417/410.2 |
| 5,861,703 | A | * | 1/1999 | Losinski | ............... | 310/330 |
| 6,098,460 | A | * | 8/2000 | Otsuchi et al. | ............... | 73/514.34 |
| 2003/0168943 | A1 | | 9/2003 | Matsuyama et al. | | |
| 2004/0253130 | A1 | * | 12/2004 | Sauciuc et al. | ............... | 417/436 |
| 2005/0116585 | A1 | | 6/2005 | Yonetake et al. | | |
| 2006/0055287 | A1 | * | 3/2006 | Kawakubo et al. | ............... | 310/348 |

FOREIGN PATENT DOCUMENTS

| EP | 0 544 405 A1 | 6/1993 |
| EP | 0 654 671 A1 | 5/1995 |
| EP | 1 528 608 A2 | 5/2005 |
| JP | 2003-520540 | 7/2003 |
| JP | 2004-263399 | 9/2004 |
| WO | WO 01/54450 | 7/2001 |
| WO | 2004077497 A2 | 9/2004 |

OTHER PUBLICATIONS

European Communication and Search Report Communication received Aug. 3, 2007.

* cited by examiner

*Primary Examiner*—Thomas M Dougherty
(74) *Attorney, Agent, or Firm*—Browdy and Neimark, P.L.L.C.

(57) ABSTRACT

An actuator, comprising at least one beam capable of generating flexural oscillations, at least one pair of electric supply terminals (23, 24) which supply oscillation-inducing electric power to the beam(s), and a holding mechanism which holds the beam(s), the holding mechanism including at least one holding member (12) to hold one portion of the beam(s) and a case (13) jointed to the holding member and configured to contain the beam(s) therein.

16 Claims, 8 Drawing Sheets

ACTUATOR

CROSS-REFERENCE TO THE RELATED APPLICATION

This application is based on and claims priority from Japanese Patent Application No. 2004-305840 filed on Oct. 20, 2004, the disclosure of which is incorporated herein by reference in its entirety.

BACKGROUND OF THE INVENTION

1. Field of the Invention

The present invention relates to a flexural oscillation type actuator used as a speaker for a small terminal device such as a mobile phone, personal computer or the like.

2. Description of Related Art

Conventionally what has been developed is a flexural oscillation type actuator of a bi-morph type or mono-morph type for use in a small terminal device, for example, as a speaker. A known example is a uni-morph type flexural oscillation type actuator in which a beam having a metallic plate referred to as a shim and a piezoelectric layer formed on one surface of the metallic plate is fixed at a central portion thereof to a holding member and configured to expand and contract longitudinally by applying an alternating signal voltage in a direction of thickness of the piezoelectric layer, thereby generating a flexural oscillation in the beam.

Also known is a flexural oscillation type actuator of a bi-morph type in which a piezoelectric layer is formed on both surfaces of a metallic plate (see Japanese Patent Application Laid-Open Disclosure No. 2003-520540, FIG. 9 of a purported International Application).

The Applicant of this application has proposed a bi-morph type flexural oscillation type actuator which comprises a beam including a plate-like member such as a metallic plate and laminated parts including piezoelectric layers and electrode layers which are formed on both surfaces of the plate-like member; one end portion of the beam is held in a case (see Japanese Patent Application No. 2004-263399).

The bimorph-type actuator for flexural oscillation includes two beams 1a and 1b and a case 2 having cavities 3 containing the beams, and has a structure in which one end of each of the beams is fixed to the case 2 by an adhesive, as shown in FIG. 17. Each of the beams 1a and 1b is composed of a shim 5 made of a metallic plate-like member and laminated parts 6 formed on both surfaces of the shim 5. Each of the laminated parts 6 has a plurality of piezoelectric layers and a plurality of electrode layers which are laminated alternately. An alternating current signal is supplied to each beam through electric supply terminals 7 and 8 to extend and contract the piezoelectric layers in a longitudinal direction of the beam so that a flexural signal is induced in each beam.

In this actuator for flexural oscillation, containing the beams 1a and 1b in the case 2 avoids breakage of the fragile piezoelectric layers due to an error by a worker during assembly and also avoids deterioration of the characteristics of each beam through attachment of dust.

Providing the electric supply terminals 7 and 8 on the case 2 prevents the problem that wirings to the beams are complicated and affect oscillation as in the actuator in Japanese Patent Application Laid-Open Disclosure No. 2003-520540 (FIG. 9) of a purported International Application.

Meanwhile, as shown in FIG. 17, inner wall surfaces 9a and 9b of each cavity of the case facing each beam have gradually curved surfaces so that, when an excessive flexural oscillation is caused by, for example, an accidental dropping impact, surface of each beam comes into contact with the inner wall surfaces at a plurality of places in a longitudinal direction of the beam. Excessive flexural oscillation may occur in the beam in a number of cases; for example, when a small mobile device such as a mobile phone installed with the flexural oscillation type actuator as a speaker is accidentally dropped on a floor surface.

In the flexural oscillation type actuator shown in FIGS. 17 and 18, the case 2 made of resin is manufactured as three pieces C1, C2 and C3 and then, in order to hold the beams 1a and 1b between these pieces forming the case 2, the beams 1a and 1b are manually assembled and held in the case by using, for example, a screw mechanism (not shown). Therefore, if the beams 1a, 1b and the case 2 are not arranged parallel to one another or if the beams are misaligned upward or downward, an interval between a surface of each beam and an inner wall surface of the case opposite the beam's surface varies. Consequently, the actuator's flexural oscillation characteristic is deteriorated, since the oscillating beams may come into contact with the inner wall surfaces of the case at irregular intervals.

SUMMARY OF THE INVENTION

An object of the present invention is to provide an actuator in which beams are arranged easily and accurately at a predetermined position in a case and the beams are held in a stable position so that the beams can oscillate without touching inner wall surfaces of the case and without deteriorating its oscillating characteristic.

To accomplish the above-mentioned object, an actuator according to one embodiment of the present invention comprises at least one beam capable of generating flexural oscillations, at least one pair of electric supply terminals which supply oscillation-inducing electric power to the beam(s), and a holding mechanism which holds the beam(s).

The holding mechanism includes at least one holding member to hold one portion of the beam(s) and a case jointed to the holding member(s) and configured to contain the beam(s) therein.

The holding member(s) is(are) fixed to the case so that the beam(s) is(are) accurately attached at a predetermined position of the case.

DETAILED DESCRIPTION OF THE PREFERRED EMBODIMENTS

Preferred embodiments of the present invention will be explained in detail with reference to the accompanying drawings below.

Figure 1:
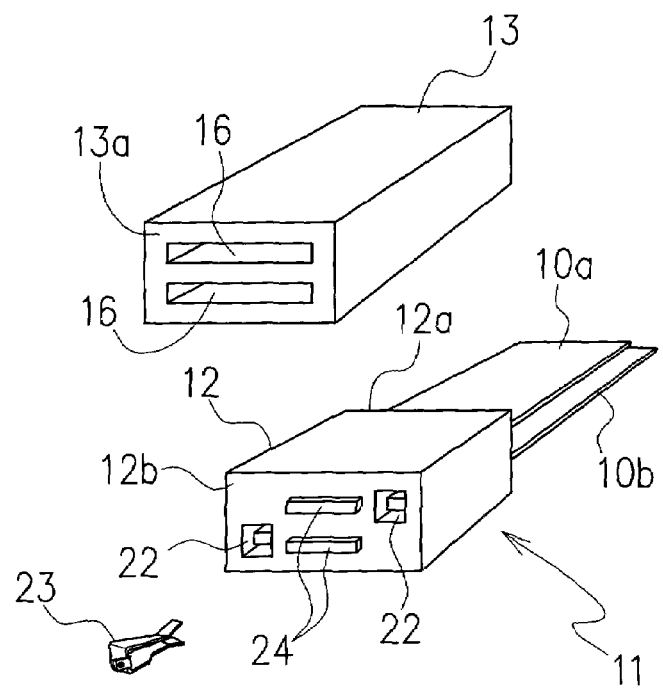
FIG. 1 is an exploded perspective view showing a structure of an actuator according to one embodiment of the present invention.

FIG. 1 illustrates a structure of an actuator according to one embodiment of the present invention. The actuator includes at least one beam capable of generating flexural oscillations. In this embodiment, two elongated rectangular beams 10a and 10b are provided. The beams 10a and 10b are held by a holding mechanism 11. In this embodiment, the holding mechanism 11 includes a holding member 12 for holding the beams 10a and 10b at one portion of each beam, and a case 13 attached to the holding member 12 at abutting end surfaces of the case 13 and the holding member 12 so that the case 13 contains the beams 10a and 10b therein.

Each of the beams 10a and 10b has a plate-like member 14 and a laminated part 15 formed on at least one surface, preferably both opposing surfaces of the plate-like member 14. The laminated part 15 includes at least one piezoelectric layer and at least one electrode layer. The structure of the laminated part will be explained in detail below.

The holding member 12 is formed integrally with the beams 10a and 10b by executing an insert-molding of a resin together with one end portion or central portion of each of the two beams 10a and 10b. The insert molding is executed at a low temperature of around 100° C. or less which is about half the Curie point of the piezoelectric layers formed on both surfaces of the beams 10a and 10b. The holding member 12 of the beams 10a and 10b is fixed to the case 13 with each of the beams 10a and 10b inserted in each of cavities 16 (see FIG. 1) formed in the case 13, by applying an adhesive (not shown) to an end surface 12a of the holding member 12 and an abutting end surface 13a of the case 13.

It is preferable that the end surfaces 12a and 13a to be adhered be flat.

Here, it is also preferable that an outer shape of the holding member 12 and an outer shape of the case 13 share a smooth outline except a surface where terminals are provided, when the holding member 12 and the case 13 are adhered. In this way, actuators according to the present invention can achieve a thinned actuator structure and a simple outline.

Figure 2:
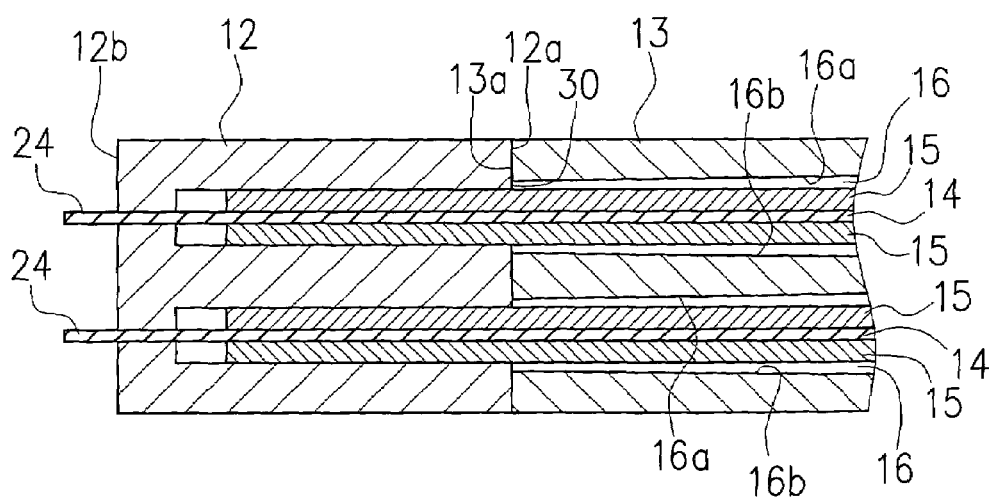
FIG. 2 is a partial enlarged sectional view enlarging a portion of a holding member of the actuator in the embodiment shown in FIG. 1.

FIG. 2 illustrates a jointed part of the holding member 12 and the case 13.

Figure 17:
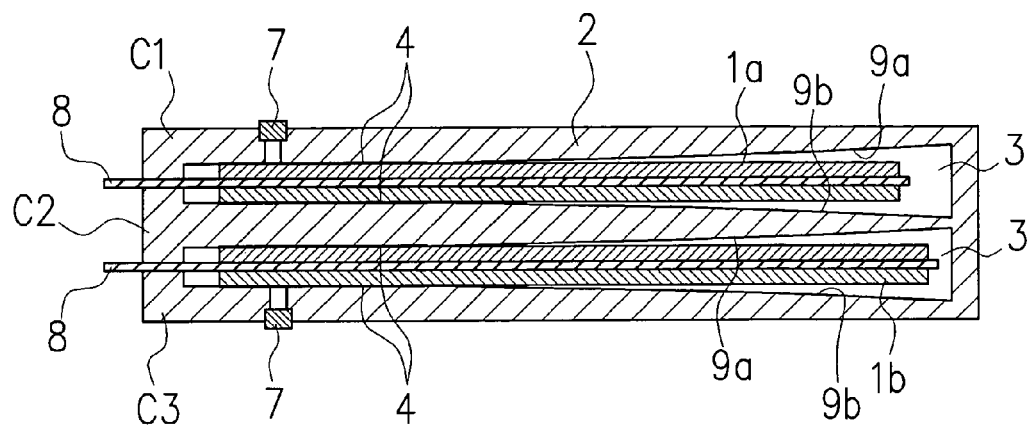
FIG. 17 is a sectional view showing an entire structure of a conventional actuator.
Figure 18:
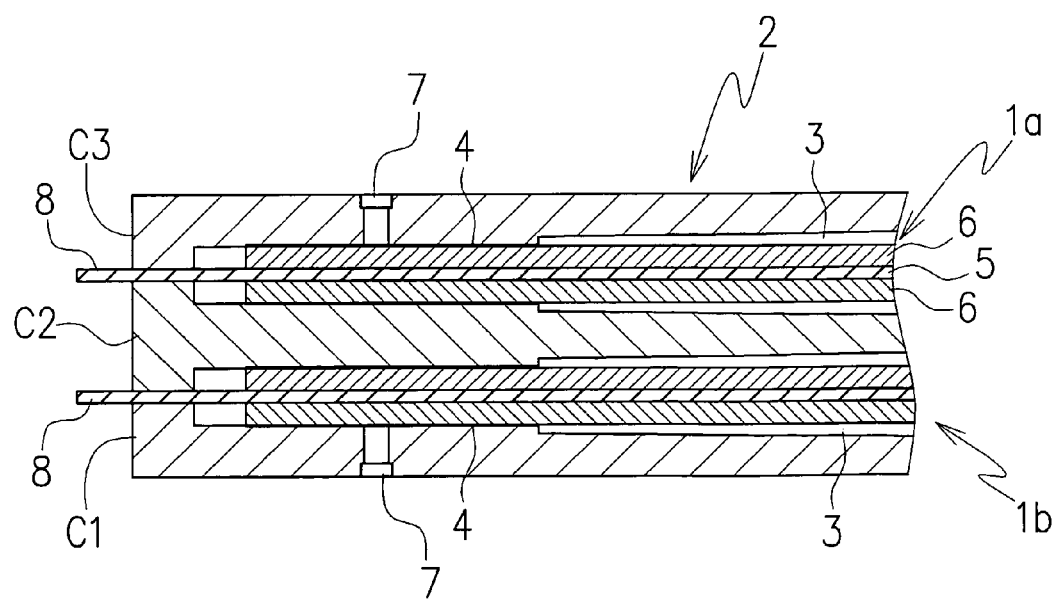
FIG. 18 is a partial enlarged sectional view showing a structure of a holding member of the actuator shown in FIG. 17.

In the embodiment, the beams 10a and 10b are completely contained within the cavities 16 of the case 13 through the entire length thereof, in a similar way to the conventional actuator shown in FIG. 17. When assembling the holding member and the case, accurate parallelization and positioning are achieved by close-fitting of the holding member 12 and the case 13, which are preferably horizontally aligned, and the end surface 12a of the holding member 12 and the end surface 13a of the case 13, which are preferably aligned perpendicular to the bottom surfaces of the holding member 12 and the case 13.

Furthermore, inner wall surfaces 16a and 16b of the cavities 16 of the case 13 facing the beams 10a and 10b have gradually curved surfaces similar in shape to the curved surfaces shown in FIG. 17; when an excessive flexural oscillation is accidentally generated in each of the beams, impact on each beam can be absorbed by contact with the inner wall surfaces at a plurality of places in a longitudinal direction of each beam.

Figure 10:
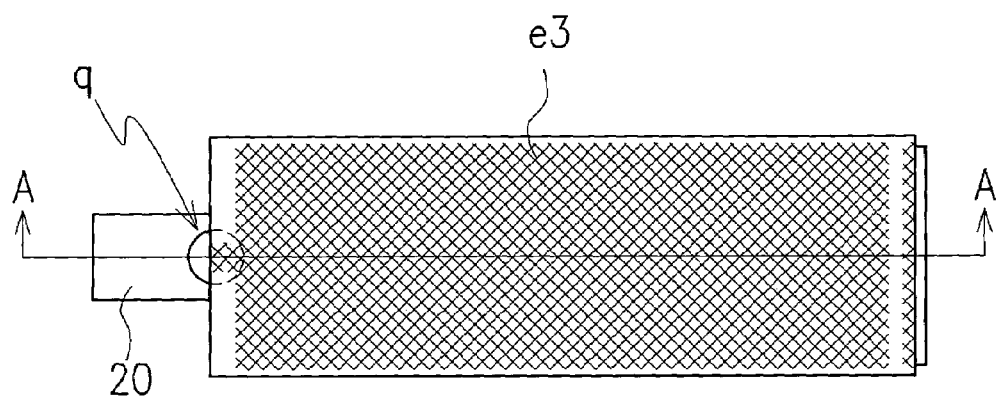
FIG. 10 is a top plan view showing a structure of a beam used in the above-mentioned embodiments.
Figure 11:
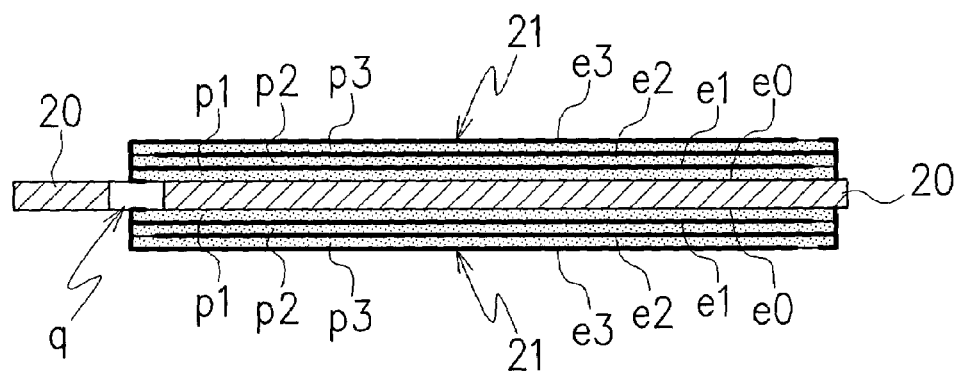
FIG. 11 is a sectional view taken along the A-A line of the beam shown in FIG. 10.

FIG. 10 here illustrates a structure of either one of the beams 10a and 10b before the insert molding is executed, and FIG. 11 is a sectional view taken along the A-A line in FIG. 10.

Referring now to FIG. 11, each of the beams includes a metallic shim 20 made of stainless steel or the like, similar to the above-mentioned plate-like member 14, and a laminated part similar to the above-mentioned laminated part 15 provided on at least one surface, and it is preferable that the laminated parts 21 be provided on both opposing surfaces of the shim 20.

Each of the laminated parts 21 here includes a plurality of layers having four electrode layers e0, e1, e2, e3 and three piezoelectric layers p1, p2, p3 which are arranged alternately, as shown in FIG. 11. The number of piezoelectric layers may be more than three, depending on embodiments. The number of electrode layers may change, according to the number of piezoelectric layers.

An earth potential is supplied from an earth terminal 24 (see FIGS. 1 and 2) as an electric supply terminal through a part of reduced width on one end of each of the shims 20 to the electrode layer e0 in contact with each of surfaces of each shim 20. The electrode layer e0 is connected through metallic layers made of conductive paint formed on end surfaces of the first and second piezoelectric layers p1 and p2 to the second and third electrode layers e2.

The uppermost electrode layer e3 of each laminated part is connected through metallic layers formed on end surfaces of the third and second piezoelectric layers p3 and p2 to the first and second electrode layers e1. The uppermost electrode layer e3 formed on each of both surfaces of each shim 20 is held between elastic spring plates formed at a leading end of a signal input terminal 23 (see FIG. 1) as the electric supply terminal inserted in each of two terminal insert openings 22 of the holding member 12 provided in the end surface 12 b opposing the beam. Thereby, an alternating current signal having a voice band is supplied through the signal input terminal 23 to the uppermost electrode layer e3 formed on each of both surfaces of each shim 20.

A ground potential is supplied below the first piezoelectric layer p1 of each laminated part (to the side nearest to the shim 20), and an alternating current signal from the signal input terminal 23 is supplied above it (to the side furthest from the shim 20). Similarly, a ground potential is supplied below and an alternating current signal is supplied above the third piezoelectric layer p3. On the contrary, an alternating current signal is supplied below the second piezoelectric layer p2, and a ground potential is supplied above it. A polarity for electrostriction that reverses the polarities of the first and third piezoelectric layers p1 and p3 is deliberately applied to the second piezoelectric layer p2.

Consequently, the first, second and third piezoelectric layers p1, p2 and p3 of each laminated part are expanded and contracted to mutually reinforce in a similar direction by the alternating current signal applied to the signal input terminal 23. In this way, it is possible to expand and contract the plurality of piezoelectric layers of each beam in the same direction through the pair of signal input terminal 23 and the ground terminal 24 in one beam by a structure in which a plurality of electrodes having the same polarity are mutually connected at the ends of a plurality of laminated piezoelectric layers. Therefore, the structure of the mechanism for supplying a signal voltage is greatly simplified and reliability is significantly increased.

Referring to FIGS. 10 and 11, a semi-circularly cutout opening q is formed at an end of each shim 20 on the holding member side of each of the beams 10a and 10b. The opening q is used to avoid a state in which a drop from the electrode layers formed on the end surface of the piezoelectric layer by screen printing or the like comes into contact with an adjacent electrode layer having the reverse polarity and produces a short circuit. The drop is formed as an unnecessary extended portion when extending the electrode layer along the end surface of the piezoelectric layer in order to connect upward and downward electrode layers having the same polarity.

In the embodiment shown in FIG. 11, the unnecessary drop extending to the end surface and the bottom surface of the first piezoelectric layer p1 occurs on the metallic layer formed on the end surfaces of the first and third layers p3 and p2 by application of a conductive material, or the like in order to connect the uppermost electrode layer e3 and the first electrode layer e1.

Under such circumstances, if the opening q is not formed, a portion of the drop makes contact with surfaces of each shim 20 kept at ground potential and produces a short circuit. By forming the opening q, it is possible to efficiently avoid generation of short circuits.

Referring again to FIG. 2, steps 30 are formed at the abutted surfaces by adhering the end surface 12a of the holding member 12 and the end surface 13a of the case 13, because the dimension of the abutting end surface 13a of the case is smaller than that of the abutted end surface 12a of the holding member 12. Each of the steps 30 is arranged to extend along a width direction of the beam. The depth of the steps has a certain value of 100 µm or less. In one embodiment, the depth of the step is set to a value of 80 µm.

By arranging to form such steps 30, it is possible to avoid the problem that the beams 10a and 10b may come into contact with the inner wall surfaces of the case 13 while the beams 10a and 10b are oscillating normally.

If the beams make contact with the inner wall surfaces during normal oscillations, the contacts deteriorate the sound quality. Therefore, forming steps 30 at the abutting end surfaces is beneficial for oscillating the beams.

Figure 3:
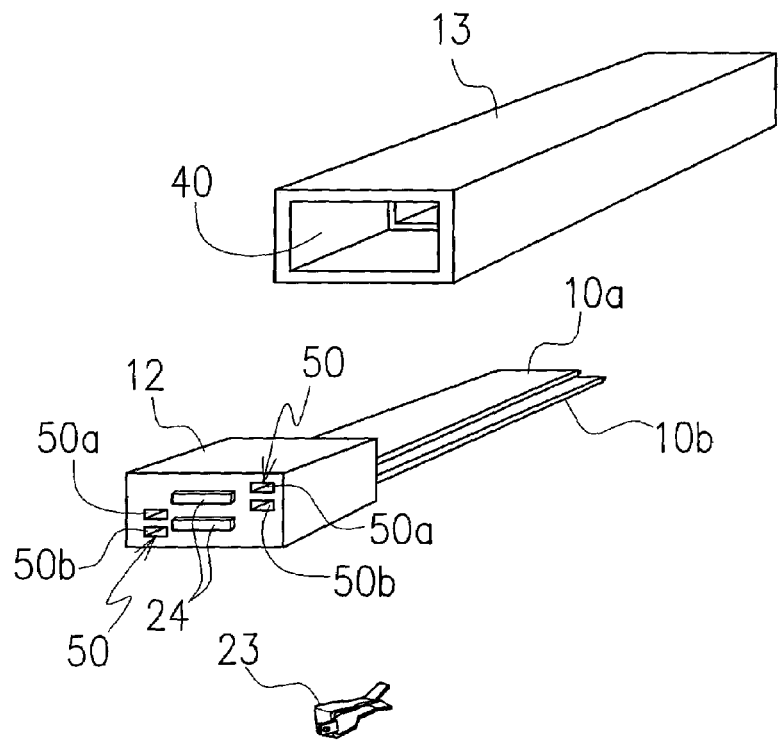
FIG. 3 is an exploded perspective view showing a structure of an actuator according to another embodiment of the present invention.
Figure 4:
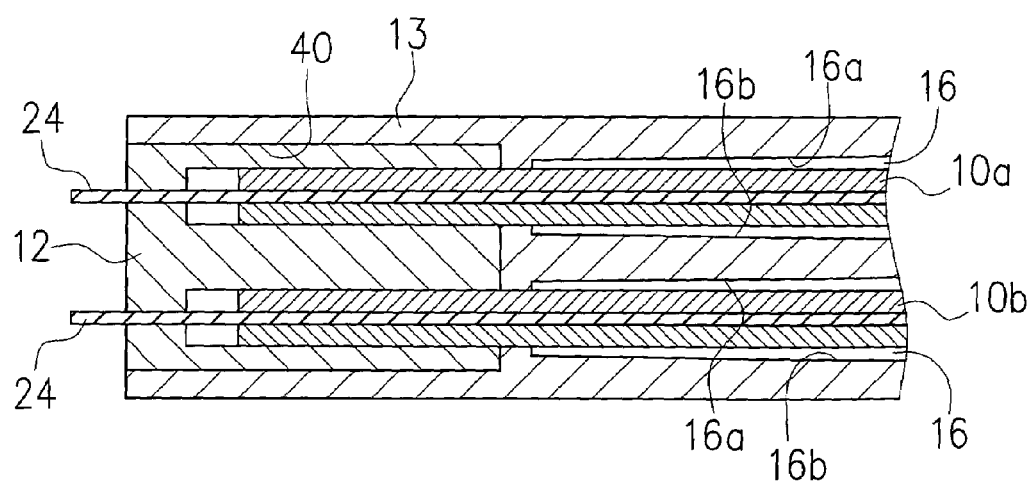
FIG. 4 is a partial enlarged sectional view enlarging a portion of a holding member of the actuator in the embodiment shown in FIG. 3.

FIGS. 3 and 4 illustrate the structure of a flexural oscillation type actuator in another embodiment according to the present invention. In this embodiment, the rectangular holding member 12 is configured to be inserted in a generally rectangular opening 40 provided in the case 13.

In the embodiment, the holding member 12 is formed integrally with the beams 10a and 10b by insert-molding a resin at a low temperature of around 100° C. or less together with one end portion of each of the two beams 10a and 10b.

The holding member 12 is securely fixed to the case 13 by inserting the beams 10a and 10b in the cavities 16 formed in the case 13 and inserting the holding member 12 in the opening 40 after an adhesive (not shown) is applied to an outer wall surface of the holding member.

As shown in FIG. 3, two sets of openings 50 for inserting terminals, which are disposed adjacently one above the other to face the beams are formed in an end of the holding member 12 opposing the beams 10a and 10b. One set of openings includes two openings 50a and 50b formed corresponding to each beam. Upward and downward spring plate portions provided on one signal input terminal 23 are inserted into one set of openings. Leading ends of the spring plate portions hold the uppermost electrode layers of each beam from above and make electrical contact with them.

FIG. 4 illustrates a jointed part of the holding member 12 and the case 13. In this embodiment, the beams 10a and 10b are completely covered throughout the entire length thereof by the case 13, in a similar way to the prior art shown in FIG. 17.

Furthermore, the inner wall surfaces 16a and 16b of each of the cavities 16 of the case 13 facing the beams 10a and 10b have gradually curved surfaces similar in shape to the curved surfaces shown in FIG. 17; when an excessive flexural oscillation accidentally occurs in each of the beams impact on each beam can be absorbed by contact with the inner wall surfaces at a plurality of places in a longitudinal direction of each beam.

Figure 5:
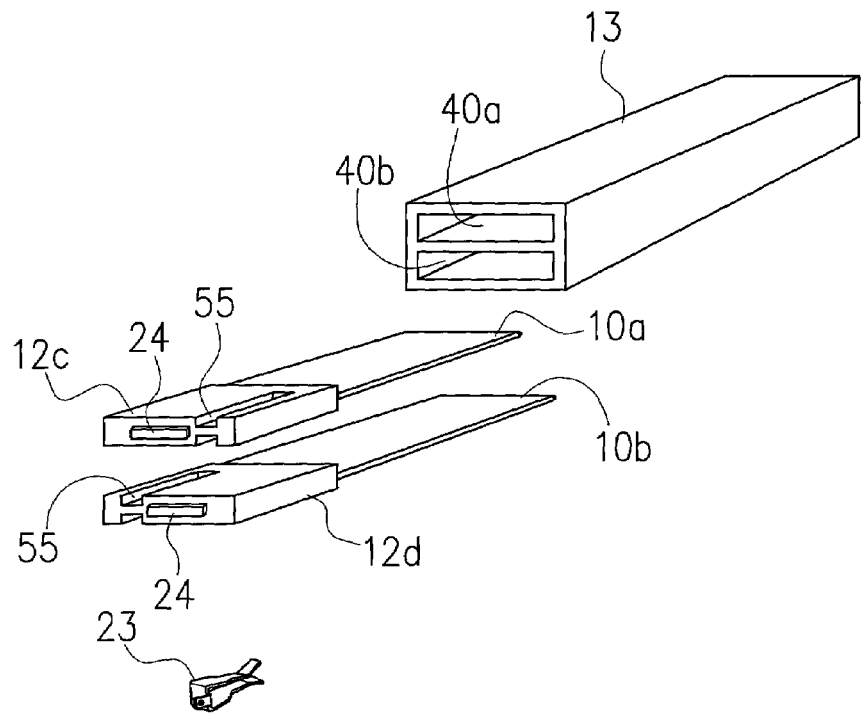
FIG. 5 is an exploded perspective view showing a structure of an actuator according to yet another embodiment of the present invention.
Figure 6:
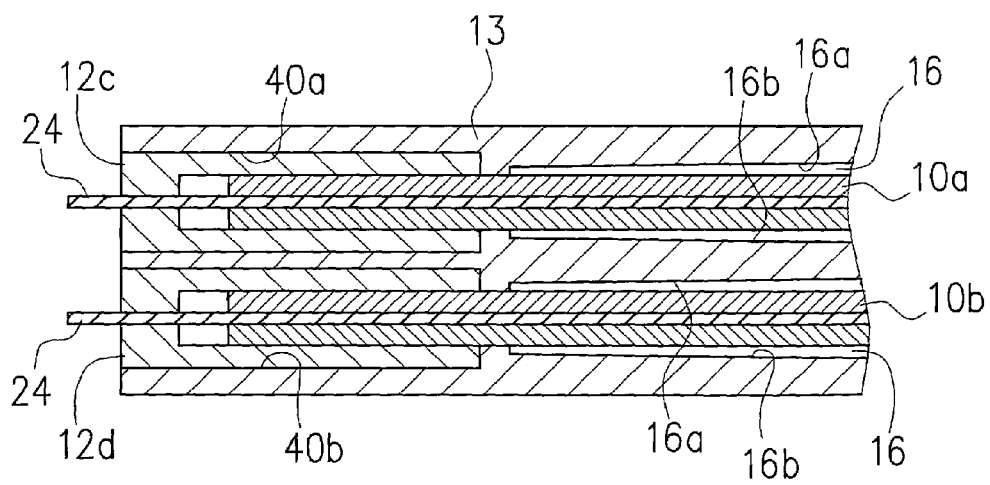
FIG. 6 is a partial enlarged sectional view enlarging a portion of a holding member of the actuator in the embodiment shown in FIG. 5.

FIGS. 5 and 6 illustrate the structure of a flexural oscillation type actuator in yet another embodiment according to the present invention. In this embodiment, as shown in FIG. 5, the holding member comprises two holding members 12c and 12d for holding the beams 10a and 10b, respectively. The holding members are formed integrally with the beams 10a and 10b by insert-molding a resin at a low temperature of around 100° C. or less together with one end portion of each of the corresponding beams 10a and 10b. In addition, in this embodiment, the holding members 12c and 12d are structured to be inserted in openings 40a and 40b, respectively, provided in the case.

When assembling, the holding members 12c and 12d are fixed to the case 13 by inserting the beams 10a and 10b in the cavities 16 formed in the case 13 and inserting the holding members 12c and 12d in the openings 40a and 40b after an adhesive is applied to outer wall surfaces of the holding members. In the embodiment, each of the signal input terminals 23, as shown in FIG. 5, is fitted in a V-shaped groove 55 formed in each of the holding members 12c and 12d to make electrical contact with the uppermost electrode layers formed on both surfaces of each beam.

FIG. 6 illustrates a jointed part of the holding members 12c and 12d and the case 13.

In this embodiment, the beams 10a and 10b are completely covered throughout the entire length thereof by the case 13, in a similar way to the prior art shown in FIG. 17.

Furthermore, the inner wall surfaces 16a and 16b of each cavity 16 of the case 13 facing the beams 10a and 10b have gradually curved surfaces so that, when an excessive flexural oscillation is generated in each of the beams, surfaces of each beam make contact with the inner wall surfaces at a plurality of places in a longitudinal direction of each beam, as shown in FIG. 17. The structure of the piezoelectric layers and the electrode layers of the beams 10a and 10b is similar to that shown in FIGS. 10 and 11.

Figure 7:
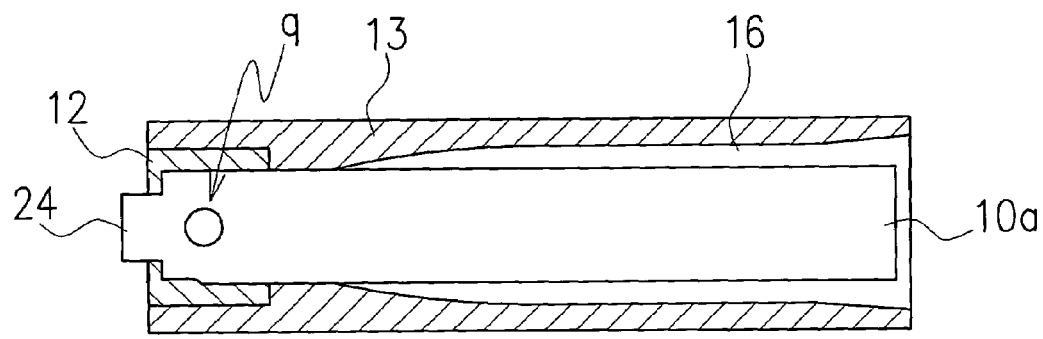
FIG. 7 is a sectional view showing the actuator in the embodiment shown in FIG. 5, sectioned in a horizontal plane passing through a center of a beam.

FIG. 7 illustrates the flexural oscillation type actuator in the embodiment shown in FIGS. 5 and 6, sectioned in a horizontal plane passing through a center of one beam 10a in FIG. 6. In FIG. 7, q denotes an opening formed in a shim of the beam 10a. The case 13 has a thinned leading end portion in order to reduce weight and avoid contact with the beam. A depression of large thickness is formed in a wall of the root portion of the case 13 and an injection hole for introducing a resin therein is disposed to align with the depression. With this structure, it is possible to avoid the inconvenience that a protrusion formed after removal of the injection hole is projected from an outer side of the case.

Figure 8:
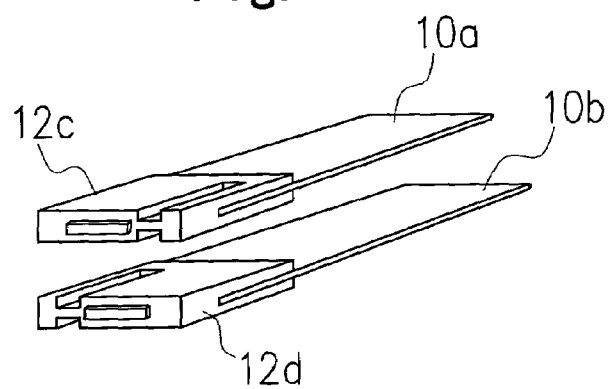
FIG. 8 is a perspective view showing beams and their holding members used in an embodiment in which the width of the holding members are set to be identical to the widths of the beams and this structure may be applied to embodiments of the actuator shown in FIGS. 5 to 7.
Figure 9:
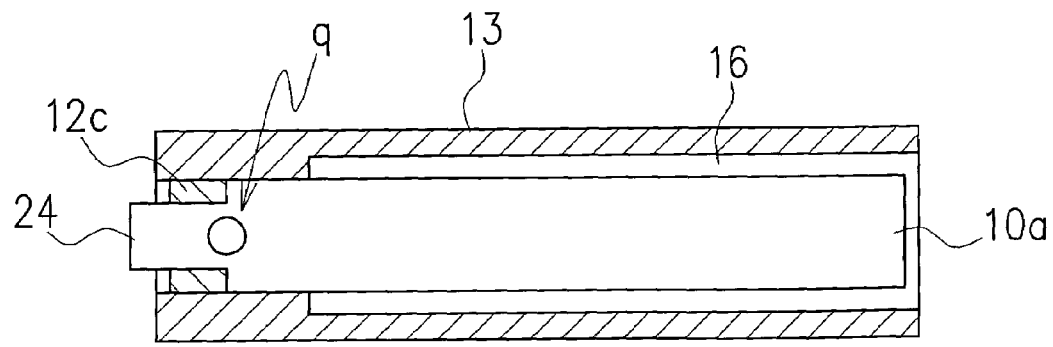
FIG. 9 is a sectional view showing an actuator which uses the beam shown in FIG. 8, sectioned in a horizontal plane passing through a center of the beam.

FIGS. 8 and 9 illustrate a flexural oscillation type actuator in another embodiment including holding members and a case each having a shape different to that of the flexural oscillation type actuator in the embodiment shown in FIGS. 5 and 6.

As shown in FIGS. 8 and 9, right and left side surfaces of the holding members 12c and 12d for holding the beams 10a and 10b are cut off so that the width of each of the holding members 12c and 12d coincides with the width of each of the beams 10a and 10b (see FIG. 8). By reducing the width of each of the holding members, the width of the case is reduced and a slim actuator is achieved. Because this kind of flexural oscillation type actuator is installed in very small electronic devices such as mobile phones, it is useful to slenderize the actuator.

FIGS. 12 to 16 illustrate embodiments in which special shapes are provided on the inner wall surfaces of the case 13 facing the beams 10a and 10b.

For convenience, only the shape of the inner wall surface of the case facing the lower surface of one beam 10a or 10b, for example, is described.

Figure 12:
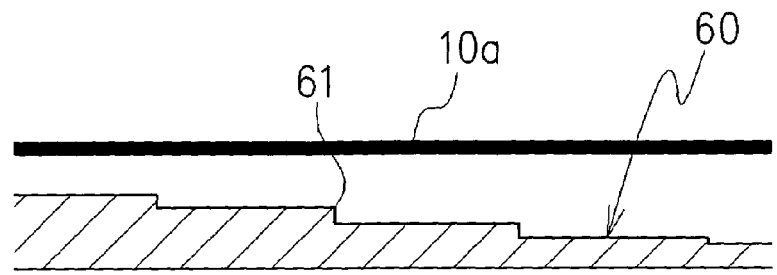
FIG. 12 is a partial sectional view showing a structure of an inner wall surface of a case applicable to another embodiment.

In FIG. 12, the case 13 has an inner wall surface having a plurality of steps 60. The steps 60 are arranged to become gradually lower towards the leading portion of the beam 10a. Therefore, if excessive bending occurs in the beam 10a due to a great impact applied to the beam 10a when the electronic device or the like containing the actuator is dropped, the lower surface of the beam makes contact with a plurality of corners 61 of the steps 60. Consequently, the beam 10a is prevented from further bending and possible breakage.

Figure 13:
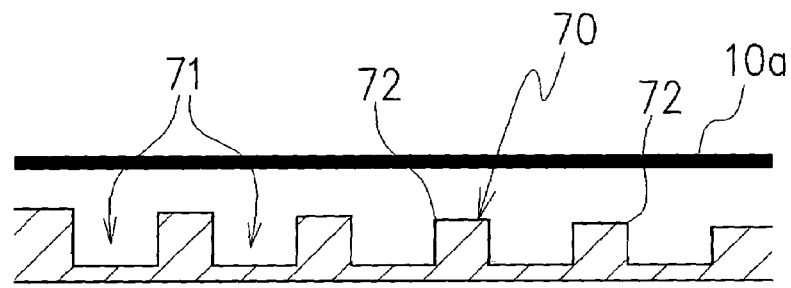
FIG. 13 is a partial sectional view showing a structure of an inner wall surface of the case applicable to yet another embodiment.

FIG. 13 illustrates the structure of another embodiment of the inner wall surface of the case 13.

In this embodiment, the case 13 has an inner wall surface having a plurality of rectangular protrusions 70. The protrusions are arranged to have projected heights set to become gradually lower towards the leading portion of the beam 10a. The protrusions are disposed at appropriate intervals, with a plurality of rectangular grooves 71 therebetween. If excessive bending occurs in the beam 10a due to a great impact applied to the beam 10a when the electronic device or the like containing the actuator is dropped, the lower surface of the beam makes contact with a plurality of corners 72 of the protrusions 70 provided on the inner wall surface of the case 13. Consequently, the beam 10a is prevented from further bending and possible breakage.

Figure 14:
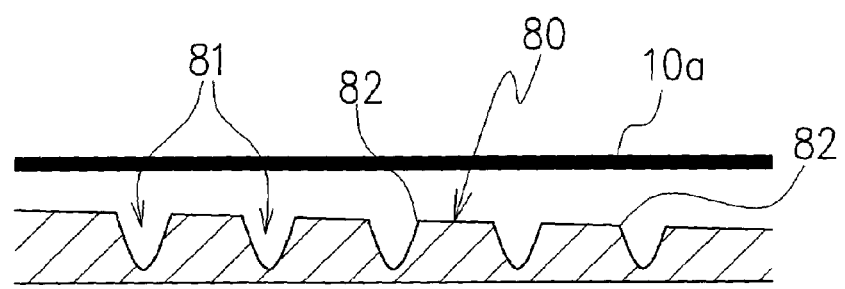
FIG. 14 is a partial sectional view showing a structure of an inner wall surface of the case applicable to yet another embodiment.

FIG. 14 illustrates the structure of yet another embodiment of the inner wall surface of the case 13.

In this embodiment, the case 13 has an inner wall surface having a plurality of trapezoidal projections 80 and a plurality of generally V-shaped grooves 81 disposed between the projections 80, which are disposed at intervals along the longitudinal direction of the beam. The projections 80 are arranged to have projected heights set to become gradually lower towards the leading portion of the beam 10a. If excessive bending occurs in the beam 10a, the lower surface of the beam makes contact with a plurality of corners 82 of the projections 80. Consequently, breakage of the beam 10a due to excessive bending is prevented.

Figure 15:
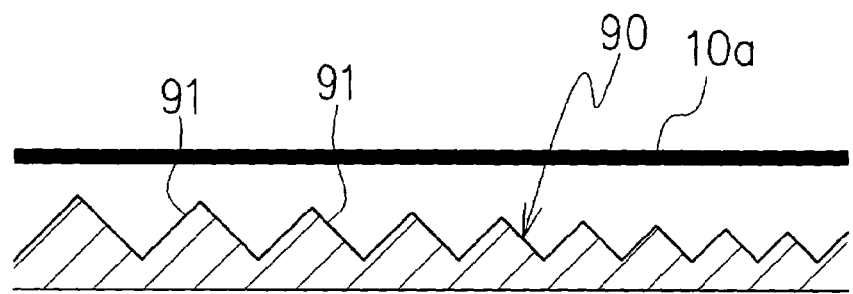
FIG. 15 is a partial sectional view showing a structure of an inner wall surface of the case applicable to yet another embodiment.

FIG. 15 illustrates the structure of yet another embodiment of the inner wall surface of the case 13.

In this embodiment, the case 13 has an inner wall surface in the shape 90 of continuously formed triangular mountains and triangular valleys.

If excessive bending occurs in the beam 10a, the lower surface of the beam 10a makes contact at a plurality of places with ridge lines 91 of the mountains. Consequently, breakage of the beam 10a due to excessive bending is prevented.

Figure 16:
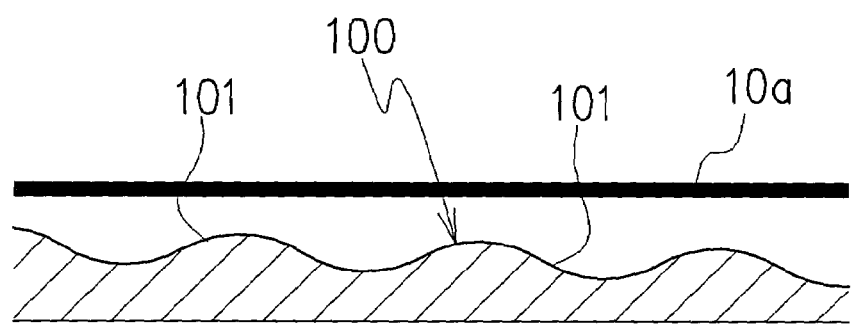
FIG. 16 is a partial sectional view showing a structure of an inner wall surface of the case applicable to yet another embodiment.

FIG. 16 illustrates the structure of one further embodiment of the inner wall surface of the case 13.

In this embodiment, the case 13 has an inner wall surface in the shape 100 of gradually curved mountains and valleys.

If excessive bending occurs in the beam 10a, the lower surface of the beam 10a makes contact with ridge lines 101 of the mountains at a plurality of places. Consequently, breakage of the beam 10a due to excessive bending is prevented.

In the above, a plurality of grooved surfaces may be provided extending along one or both inner wall surfaces of the case in a longitudinal direction or a width direction of the beam.

In the above-mentioned embodiments, the beam and the inner wall surface of the case have been adapted to achieve line contact or surface contact at the plurality of places. However, a plurality of bars each having a sharp leading end and an appropriate height may be provided on a flat inner surface of the case so that a point contact is established between the curved beam and the leading end of each bar.

Moreover, the example in which the shim of the beam is made of a metallic plate has been shown in the embodiments. However, the shim may be made of some other material such as CFRP (Carbon Fiber Reinforced Plastic).

Furthermore, in the above-mentioned embodiment, two beams have been held by the holding member(s) and contained in the case. However, there may be any number of beams, for example, one, or three or more.

In addition, a cantilever structure has been exemplified, in which one end of the beam is held. However, the present invention may be applied to a structure in which a central portion of the beam is held in the longitudinal direction thereof.

Furthermore, the example has been shown in which holding of the beam by the holding member(s) is executed. However, instead of this, the beam or beams may be held to the holding member or holding members by use of an adhesive or adhesive tape, or by some other suitable holding method such as press-fitting of the beam (s) into a cavity provided in the holding member (s).

The example for fitting the flexural oscillation type actuator as a speaker in a mobile phone or the like has been shown. However, the flexural oscillation type actuator may be applied to other suitable mobile terminal devices or suitable electronic instruments, such as stationary computers or displaying devices, as a speaker.

According to the flexural oscillation type actuator of the present invention, as mentioned above, the beam can be mounted at a predetermined position of the case accurately and easily, and the beam can be maintained in a stable mounted state without the beam coming into contact with the inner wall of the case when the beam is oscillated.

Because the entire beam is contained in the case, it is possible to avoid breakage of the fragile piezoelectric layer due to an error by a worker during assembly or deterioration of the characteristics of the beam through attachment of dust thereto.

The flexural oscillation type actuator has a structure in which the holding member and the case are manufactured separately and fitted and jointed by an abhesive; angular misalignment from the parallel of the beam and the case, and misalignment of the upward and downward position are difficult to occur; therefore intervals between the upper and lower surfaces of the beam and the inner wall surfaces of the case are uniform. Consequently, the surfaces of the beam and the inner wall of the case do not come into contact until excessive oscillation occurs, hence preventing deterioration of the characteristics of the flexural oscillation type actuator.

Because the holding member is made by insert-forming a resin together with one end portion or central portion of the beam, the holding member has a structure that allows the omission of processes and effort during assembly, thus enabling realization of the dimensional accuracy desirable to achieve repeatability.

In addition, because the formation of the holding member is executed at the low temperature of 100° C. or less which is sufficiently lower than the Curie point of the piezoelectric layers formed on both surfaces of each beam, deterioration of the characteristics of the piezoelectric layers is prevented.

What is claimed is:

1. An actuator, comprising:
   two or more beams capable of generating flexural oscillations;
   electric supply terminals which supply oscillation-inducing electric power to each of the beams; and
   a holding mechanism which contains and holds each beam,
   wherein the holding mechanism includes at least one holding member to hold one portion of each beam and a case which is provided with a cavity corresponding to each beam, and the cavity is configured to contain each beam which is held by the holding member(s),
   wherein the case is combined with the holding member(s) and each beam is inserted in the cavity to move freely in the cavity.

2. The actuator according to claim 1,
   wherein each of the beams includes a plate-like member and a laminated part formed on at least one surface of the plate-like member,
   wherein the laminated part includes at least one piezoelectric layer and at least one electrode layer.

3. The actuator according to claim 1,
   wherein each of the beams includes a plate-like member and laminated parts formed on both opposing surfaces of the plate-like member,
   wherein each of the laminated parts includes at least one piezoelectric layer and at least one electrode layer.

4. The actuator according to claim 1,
   wherein the holding member(s) holds(hold) one end portion or central portion of each of the beams.

5. The actuator according to claim 4,
   wherein the holding member(s) is(are) formed by an insert molding of a resin together with the one end portion or central portion of each beam.

6. The actuator according to claim 5,
   wherein the insert molding is executed at a low temperature of 100 □ or less.

7. The actuator according to claim 1,
   wherein the holding member and the case are jointed by adhering abutting end surfaces of the holding member and the case.

8. The actuator according to claim 1,
   wherein the holding member(s) and the case are jointed by inserting an end portion of the holding member(s) in at least one opening provided in one end of the case and adhering the holding member(s) and the case.

9. The actuator according to claim 1,
   wherein inner wall surfaces which are two opposite surfaces in each cavity tilt at an angle to have a space which becomes gradually larger towards an oscillating end of the beam.

10. The actuator according to claim 1,
    wherein a width of the beam is set to be identical to that of the holding member for holding the beam.

11. The actuator according to claim 7,
    wherein the holding member is jointed to be flush with the case at the abutting end surfaces.

12. The actuator according to claim 1,
    wherein inner wall surfaces of the case facing the beam(s) have a shape that allows contact with surfaces of the beam(s) at points, lines or surfaces at a plurality of places in a longitudinal direction of the beam(s).

13. The actuator according to claim 1,
    wherein inner wall surfaces of the case facing the beam(s) have gradually curved surfaces, stepped surfaces, or a plurality of grooved surfaces extending along a longitudinal direction of the beam(s).

14. The actuator according to claim 7,
    wherein the abutting end surfaces of the holding member and the case are adhered with steps each of which is approximately 100 μm or less, and each of the steps extends along a width direction of the beam(s).

15. The actuator according to claim 2,
    wherein one portion of the plate-like member which projects from one end of the laminated part is provided on the beam for an earth terminal,
    wherein an opening is provided in a boundary between the one portion and the laminated part.

16. The actuator according to claim 7,
    wherein the abutting end surface of the case has an area smaller than that of the holding member.

* * * * *